United States Patent
Oh et al.

[11] Patent Number: 5,991,343
[45] Date of Patent: Nov. 23, 1999

[54] TRELLIS DECODER OF A DTV

[75] Inventors: Dae-Il Oh; Myung-Sik Kim, both of Kyoungki-do; Won-Jin Lee, Seoul, all of Rep. of Korea

[73] Assignee: Hyundai Electronics Ind Co., Ltd., Kyoungki-do, Rep. of Korea

[21] Appl. No.: 08/902,140

[22] Filed: Jul. 30, 1997

[30] Foreign Application Priority Data

Jan. 20, 1997 [KR] Rep. of Korea .................. 97-1527

[51] Int. Cl.$^6$ .................. H03D 1/00; H04L 27/06; G06F 11/10
[52] U.S. Cl. .................. 375/341; 375/265; 375/340; 371/43.7
[58] Field of Search .................. 375/265, 341, 375/262, 340; 371/43.4, 43.6, 43.7; 341/94, 81; 704/242

[56] References Cited

U.S. PATENT DOCUMENTS

| | | | |
|---|---|---|---|
| 4,905,317 | 2/1990 | Suzuki et al. | 371/43.7 |
| 5,432,803 | 7/1995 | Liu et al. | 375/340 |
| 5,859,861 | 1/1999 | Oh | 371/43.7 |

*Primary Examiner*—Stephen Chin
*Assistant Examiner*—Betsy L. Deppe
*Attorney, Agent, or Firm*—McAulay Nissen Goldberg Kiel & Hand, LLP

[57] ABSTRACT

A trellis decoder uses a branch metric unit, an ASC unit, a maximum likelihood value detector, and a normalization unit in common by time-division method to realize a trellis coding interleaver used in a DTV. The trellis decoder includes path memories, state metric memories and traceback units each as many as required in the trellis coding interleaver.

8 Claims, 9 Drawing Sheets

TRELLIS DECODER OF A DTV

BACKGROUND OF THE INVENTION

1. Field of the Invention

The present invention relates to a trellis decoder of a DTV (Digital Television) and, more particularly, to a trellis decoder using Viterbi algorithm.

2. Discussion of Related Art

ATSC (Advanced Television Systems Committee) in America has determined to adopt 8VSB (Vestigial Sideband) as a transmission system, which employs a channel coding system comprising an R-S (Reed-Solomon) decoder and a trellis decoder using Viterbi algorithm as shown in FIG. 1.

A simple Viterbi encoding algorithm is described in the following example of a convolutional encoder whose encoding rate R is 1/2, constraint length K is 3, and generating polynomial expressions are given by $G1=1+X+X^2$ and $G2=1+X^2$.

As shown in FIG. 2, a convolutional encoder comprises a 2-bit shift register 1, and two adders 2 and 3 for performing modulo-two additions. The outputs G1 and G2 are dependent on the state and output of the shift register 1, as shown in a trellis diagram of the outputs with time in FIG. 3. In the diagram, each point represents the state of the shift register 1, branch of a solid line a transition with the input of 0, and branch of a dotted line a transition with the input of 1. The numerals on each branch indicate the output values G1 and G2 when a transition takes place in the branch.

As shown in FIG. 3, two paths are combined in each state. According to a Viterbi algorithm based on the maximum likelihood decoding system, the more likely one of the two paths is chosen but the other is ignored. This means that the smaller one of two path values is selected but the larger one is truncated.

Thus selected path is referred to as "survivor" and each state holds information concerning the path as much as a decision depth or truncation depth. The most likely path to each state is selected for the purpose of tracing it back to accomplish an decoding operation.

FIG. 4 shows a trellis decoder based on the Viterbi decoding algorithm. Referring to FIG. 4, the trellis decoder comprises a branch metric unit 11, an ACS (Add-Compare-Select) unit 12, a maximum likelihood value detector 13, a normalization unit 14, a path memory 15, a state metric memory 16, and a traceback unit 17.

The branch metric unit 11 operates a branch metric of received input signals and a reference value in each branch to subtract the maximum likelihood value from the output of the ACS unit 12. This makes it possible to hold a path metric value in a memory of low capacity. The path memory 15 stores information concerning the path in each state and the state metric memory 16 stores state metric values. The traceback unit 17 searches for a state having a smallest path metric value in the present stage to use it as an initial value. This value is used to control the path memory 15 and perform a traceback for the purpose of looking for the original input data devoid of errors.

The digital transmission system which is suggested for the ground control communication by ATSC employs an NTSC interference removing filter in addition to the above-described trellis decoder in order to maximize its service area.

The NTSC interference removing filter installed in a DTV receiver, as shown in FIG. 5, comprises a delay unit 21 for delaying an input signal, and a subtracter 22 for subtracting the output of the delay unit 21 from the input signal.

The NTSC interference removing filter is not always used but selectively used by the determination of the receiver according to the amount of NTSC co-channel interference. Because the NTSC interference removing filer is available with $1-D^{12}$ channels, it actually limits the use of the trellis decoder.

Therefore, to minimize the structure of the trellis decoder of a DTV receiver when the NTSC interference removing filter is used, the transmitter uses a trellis coding interleaving comprising twelve equivalent trellis encoders TE1 to TE12, and input/output selectors S1 and S2, as shown in FIG. 6. Instead of the trellis decoders D1 to TD12 of $1-D^{12}$ channels, the receiver comprises twelve equivalent trellis decoders TD1 to TD12 arranged in parallel, and input/output selectors S3 and S4, as shown in FIG. 7. As a result, the receiver can be realized by using twelve trellis decoders for 1-D channels with the reduction in the hardware costs and complexity of design.

To realize the trellis decoders in a DTV receiver of ATSC standards, it is required to use twelve equivalent trellis decoders having the construction as shown in FIG. 3. The use of twelve trellis decoders can make the design easier but results in the increase of cost for hardware.

SUMMARY OF THE INVENTION

Accordingly, the present invention is directed to a trellis decoder of a DTV that substantially obviates one or more of the problems due to limitations and disadvantages of the related art.

An object of the present invention is to provide a trellis decoder of a DTV, which can be simplified in hardware construction by using a branch metric unit, an ACS unit, a maximum likelihood value detector, and a normalization unit in common by time-division method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the trellis decoder uses a branch metric unit, an ASC unit, a maximum likelihood value detector, and a normalization unit in common by time-division method to realize a trellis coding interleaver used in a DTV. The trellis decoder comprises path memories, state metric memories and traceback units each as many as required in the trellis coding interleaver.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 9:
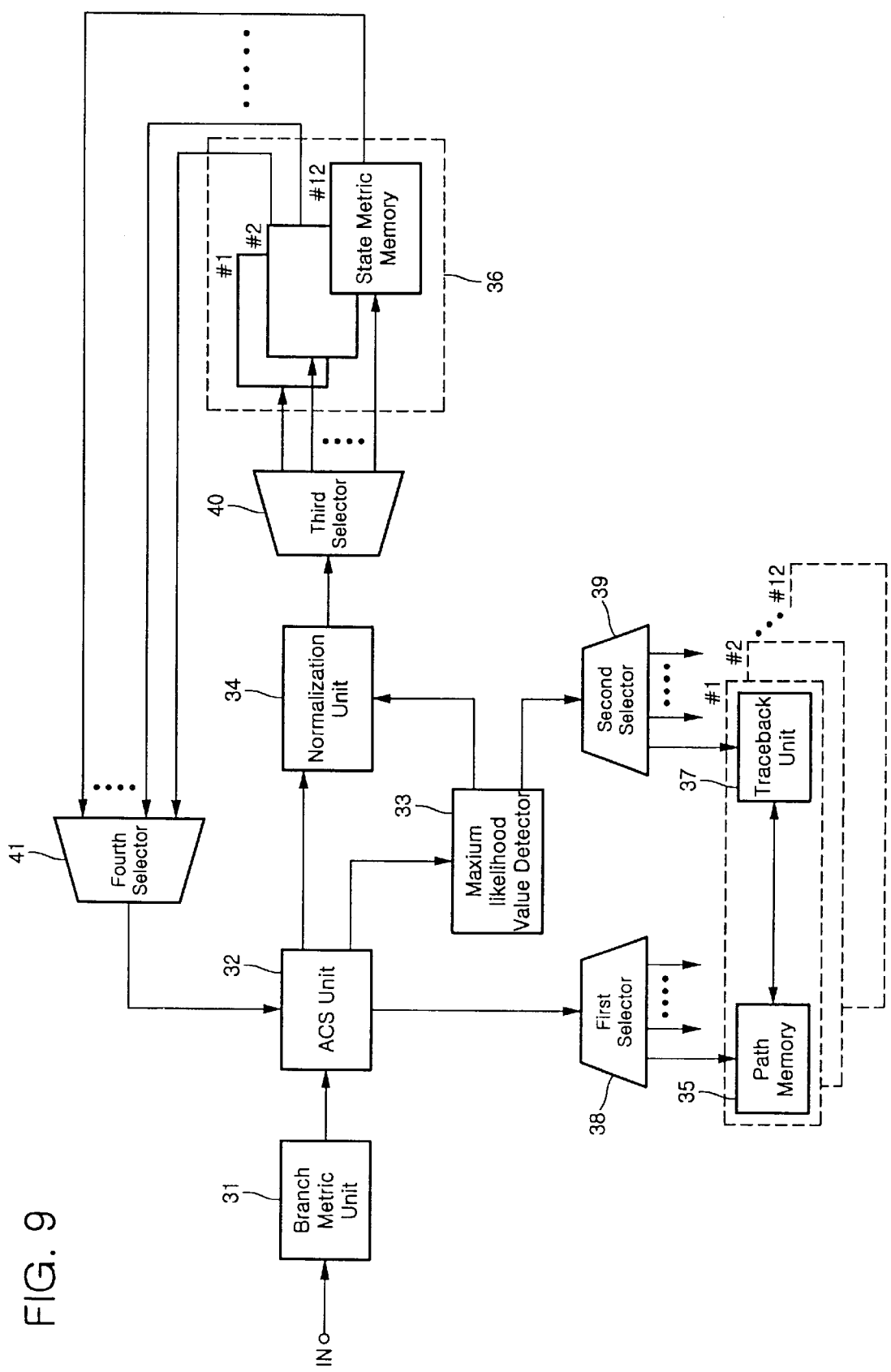
FIG. 9 is a view of a trellis decoder of a DTV in accordance with a first preferred embodiment of the present invention.

FIG. 9 shows a trellis decoder of a DTV in accordance with a first preferred embodiment of the present invention. Referring to FIG. 9, the trellis decoder comprises: a branch metric unit 31 for performing a branch metric operation of a received input signal and a reference value of each branch; an ACS unit 32 for operating the state metric values of the path in each state from the output of the branch metric unit 31; a maximum likelihood value detector 33 for detecting the most likely survivor and the state metric value of the most likely path from the state metric value transferred from the ACS unit 32; a normalization unit 34 for performing a normalization using the state metric value transferred from the ACS unit 32 and that of the most likely path out of the paths in each state received from the maximum likelihood value detector 33; twelve path memories 35 for storing information concerning the path transferred from the ACS unit 32; a third selector 40 for controlling the output of the normalization unit 34 to be stored in a proper one of twelve state metric memories 36; twelve state metric memories 36 for storing the state metric value transferred from the third selector 40; twelve traceback units 37 receiving the address of the state having the most likely path from the maximum likelihood value detector 33 to control traceback and decoding operation; a first selector 38 comprising a 1-to-12 de-multiplexer and controlling the information concerning the path transferred from the ACS unit 32 to be stored in a proper one of the path memories 35; a second selector 39 comprising a 1-to-12 de-multiplexer and controlling the output of the maximum likelihood value detector 33 to be transferred into a proper one of the traceback units 37; and a fourth selector 41 comprising a 12-to-1 multiplexer and controlling the output of the normalization unit 34 to be transferred into the ACS unit 32.

In the first embodiment of the present invention as constructed above, the received code matrix is transferred into an input terminal IN to operate a branch metric in the branch metric unit 31. The output is transmitted to the ACS unit 32.

The ACS unit 32 receives the branch metric transferred from the branch metric unit 31 and the state metric values from the state metric memories 36 to obtain path and state metric value. The path value obtained by the ACS unit 32 is transferred into and stored in a proper one of the twelve path memories 35 through the first selector 38.

The maximum likelihood value detector 33 detects the most likely path and the state having the most path from the state metric value transferred from the ACS unit 32. The address of the state having the most likely path is transmitted to a proper one of the twelve traceback units 37 through the second selector 39. The state metric value of the most likely path is transferred into the normalization unit 34.

The normalization unit 34 performs a normalization using the state metric values transferred from the ACS unit 32 and the state metric value of the most likely path from the maximum likelihood value detector. The output is transmitted to a proper one of the twelve state metric memories 36 through the third selector 40.

Figure 7:
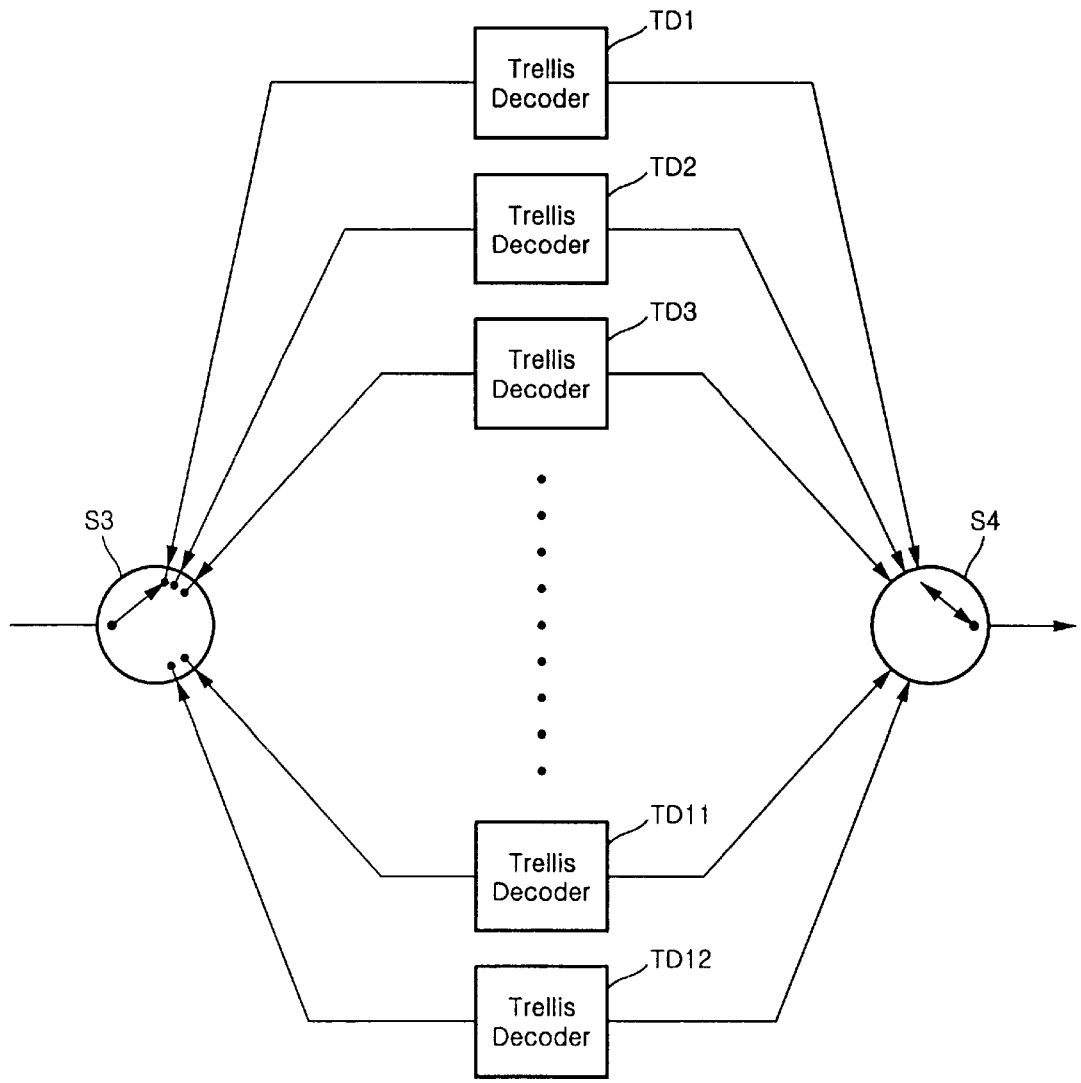
FIG. 7 is a view of a general trellis coding deinterleaver.
Figure 8:
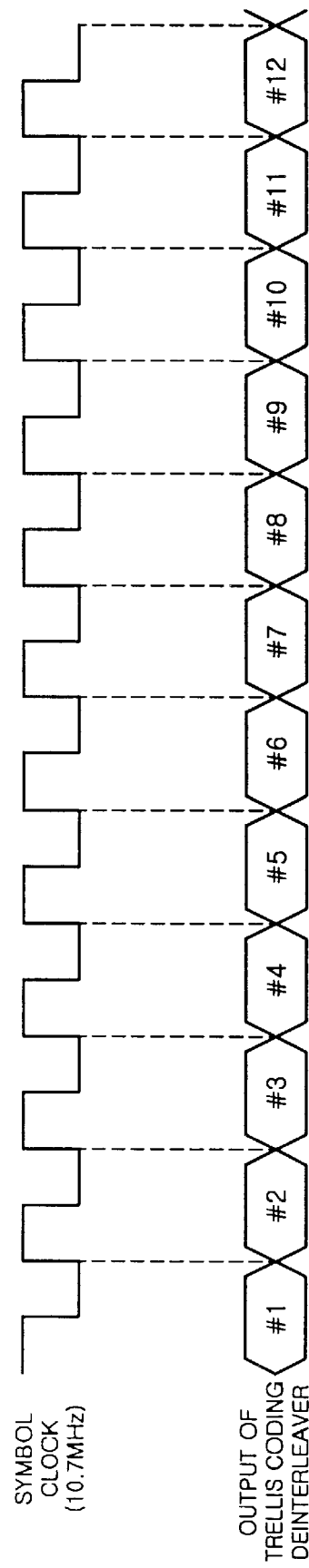
FIG. 8 is a timing diagram of the output of the general trellis coding interleaver.

The twelve state metric memories respectively correspond to the twelve trellis decoders constituting the trellis coding deinterleaver as shown in FIG. 7 and store the state metric values corresponding to the trellis decoders. A proper one of the state metric values stored in the state metric memories 36 is transferred into the ACS unit 32 through the fourth selector 41.

The traceback units 37 receives the information concerning the state having the most likely path transferred from the maximum likelihood value detector 33 through the second selector to trace back the path memories 35 and determine the decoding value.

Figure 1:
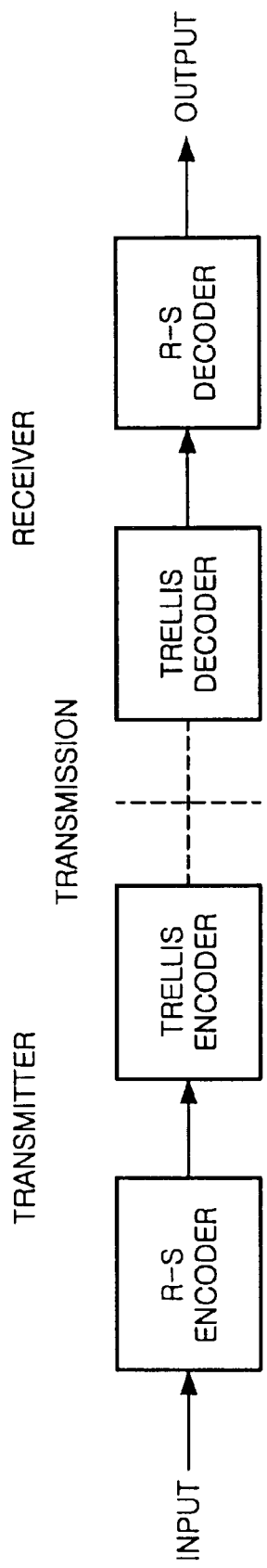
FIG. 1 illustrates the channel coding system of a general DTV.
Figure 2:
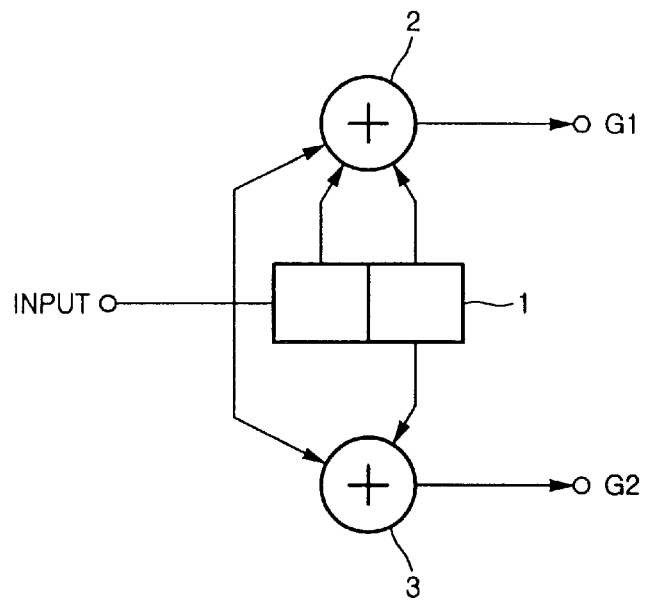
FIG. 2 is a block diagram of a general convolutional encoder.
Figure 5:
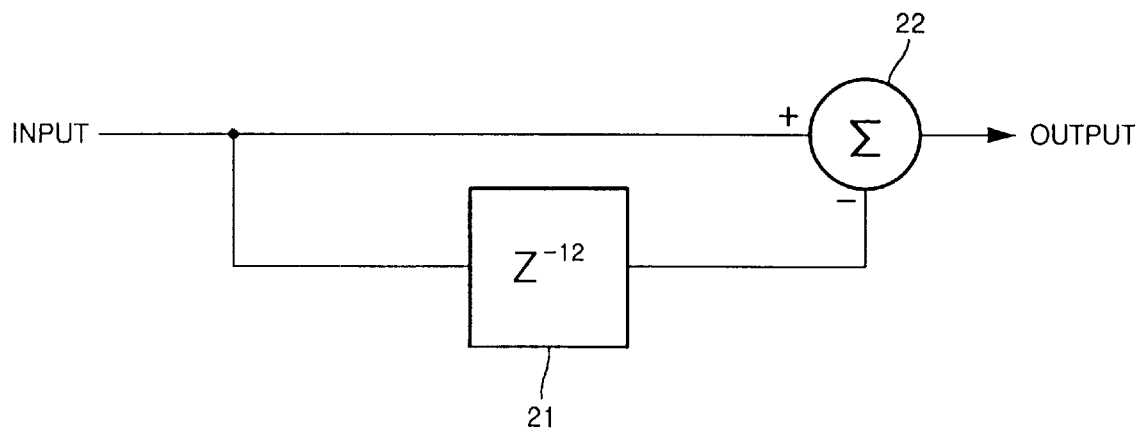
FIG. 5 is a view of a general NTSC interference removing filter.
Figure 3:
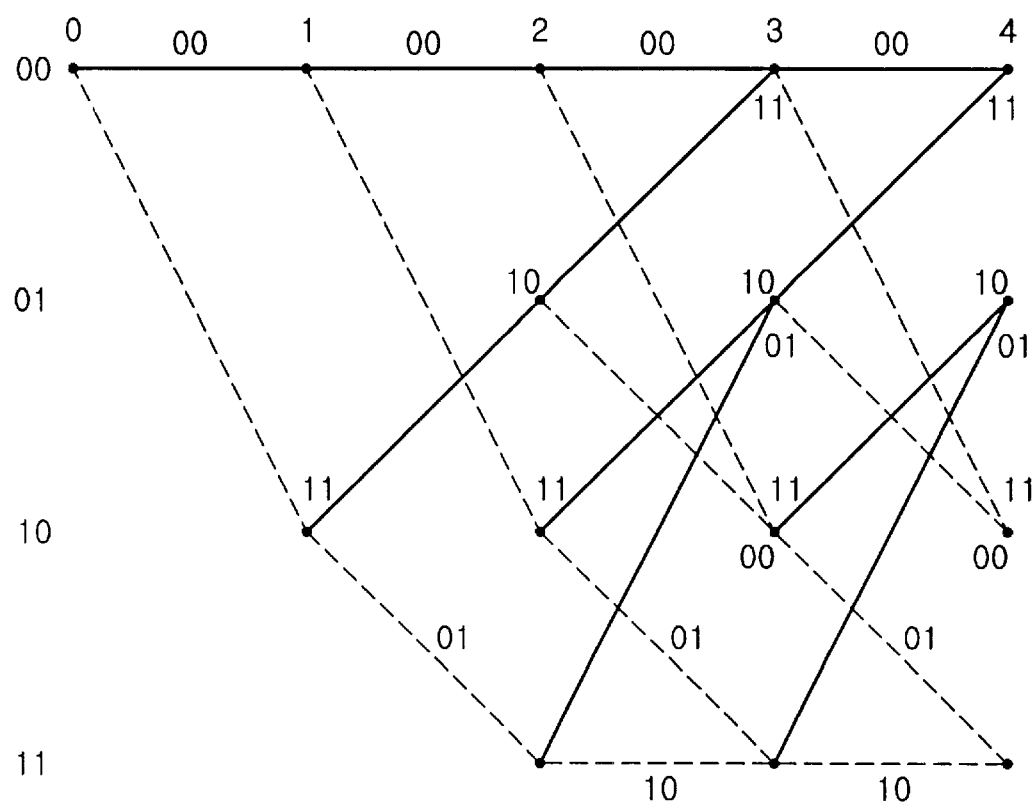
FIG. 3 is a trellis diagram of the convolutional encoder in FIG. 2.
Figure 4:
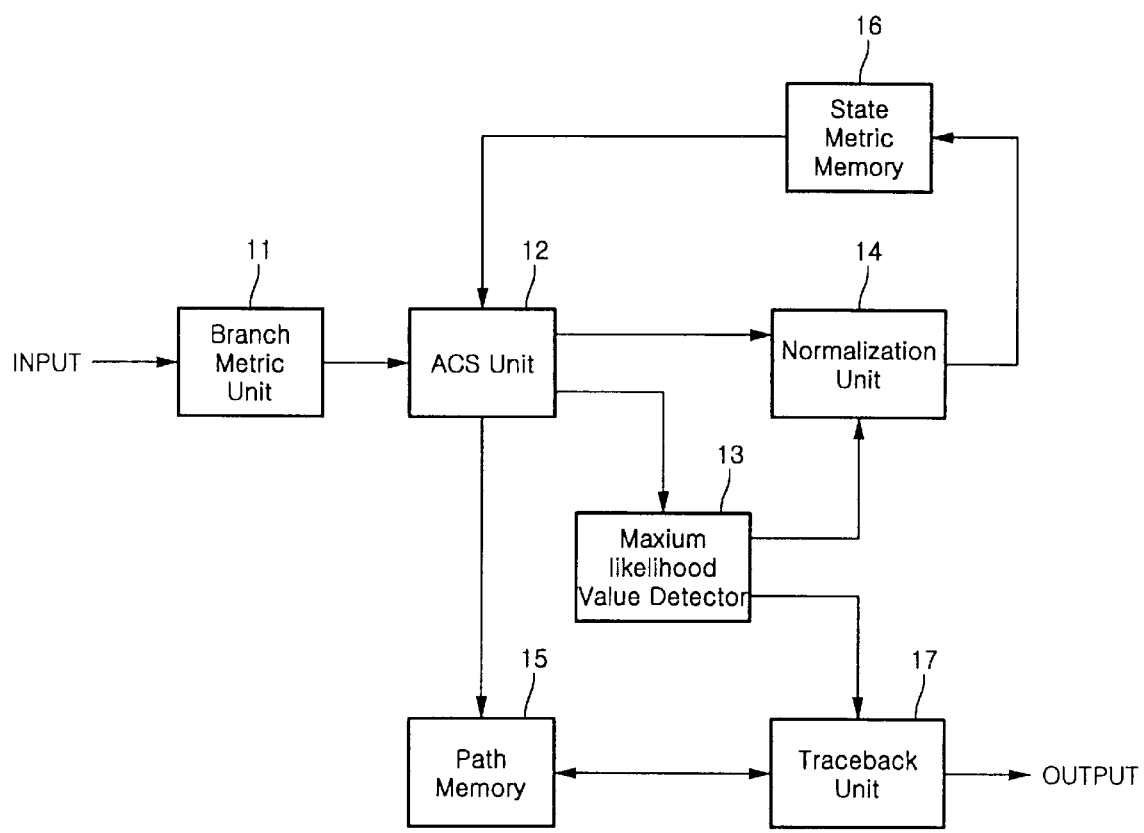
FIG. 4 is a block diagram of a conventional trellis decoder.
Figure 6:
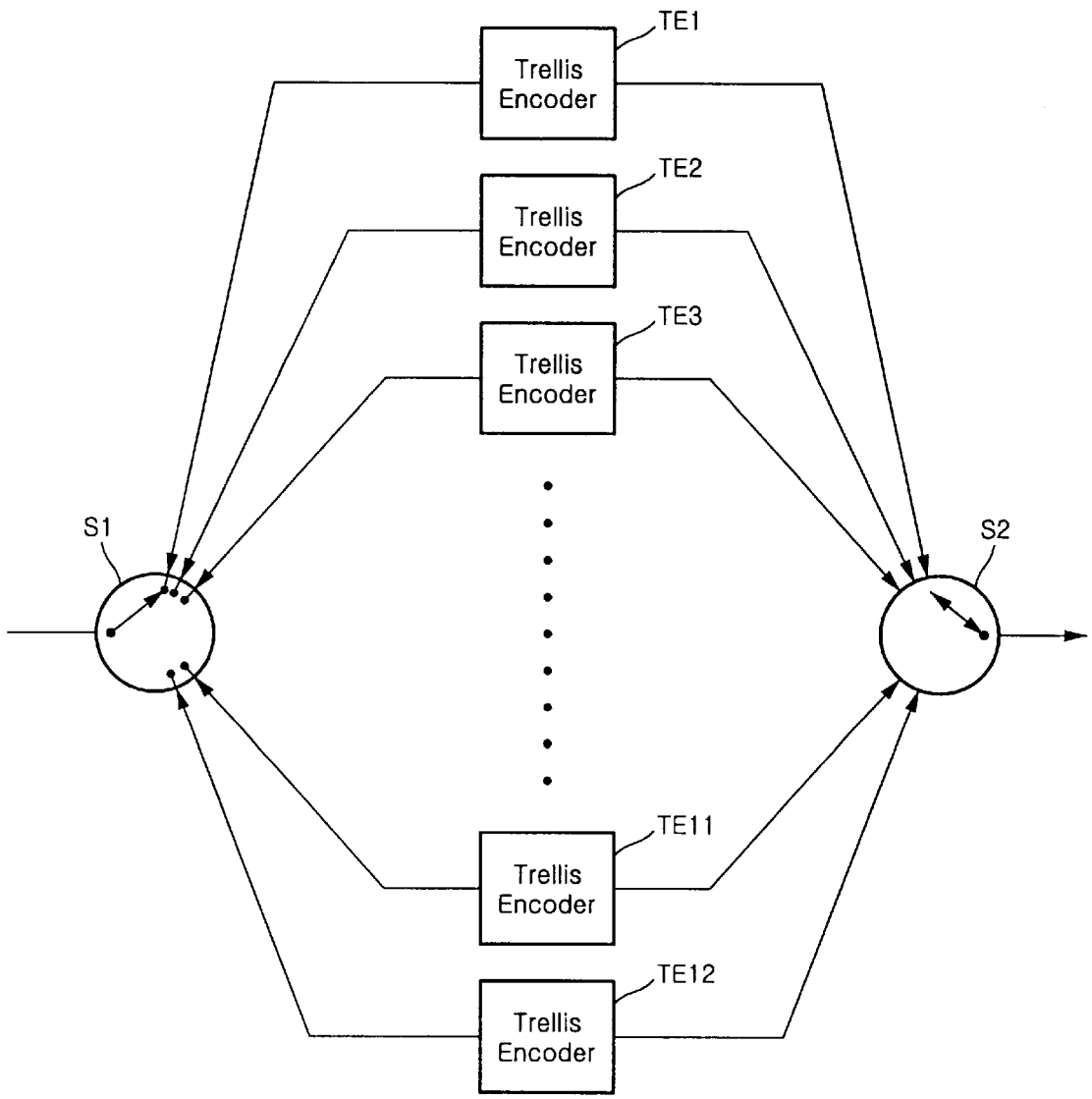
FIG. 6 is a view of a general trellis coding interleaver.

The twelve trellis decoders constituting the trellis coding deinterleaver in FIG. 6 have the branch metric unit 31, ACS unit 32, maximum likelihood value detector 33, and normalization unit 34 in common by a time-division method. Therefore, it is required to have a controller for controlling the first to fourth selectors 38 to 41.

Figure 10:
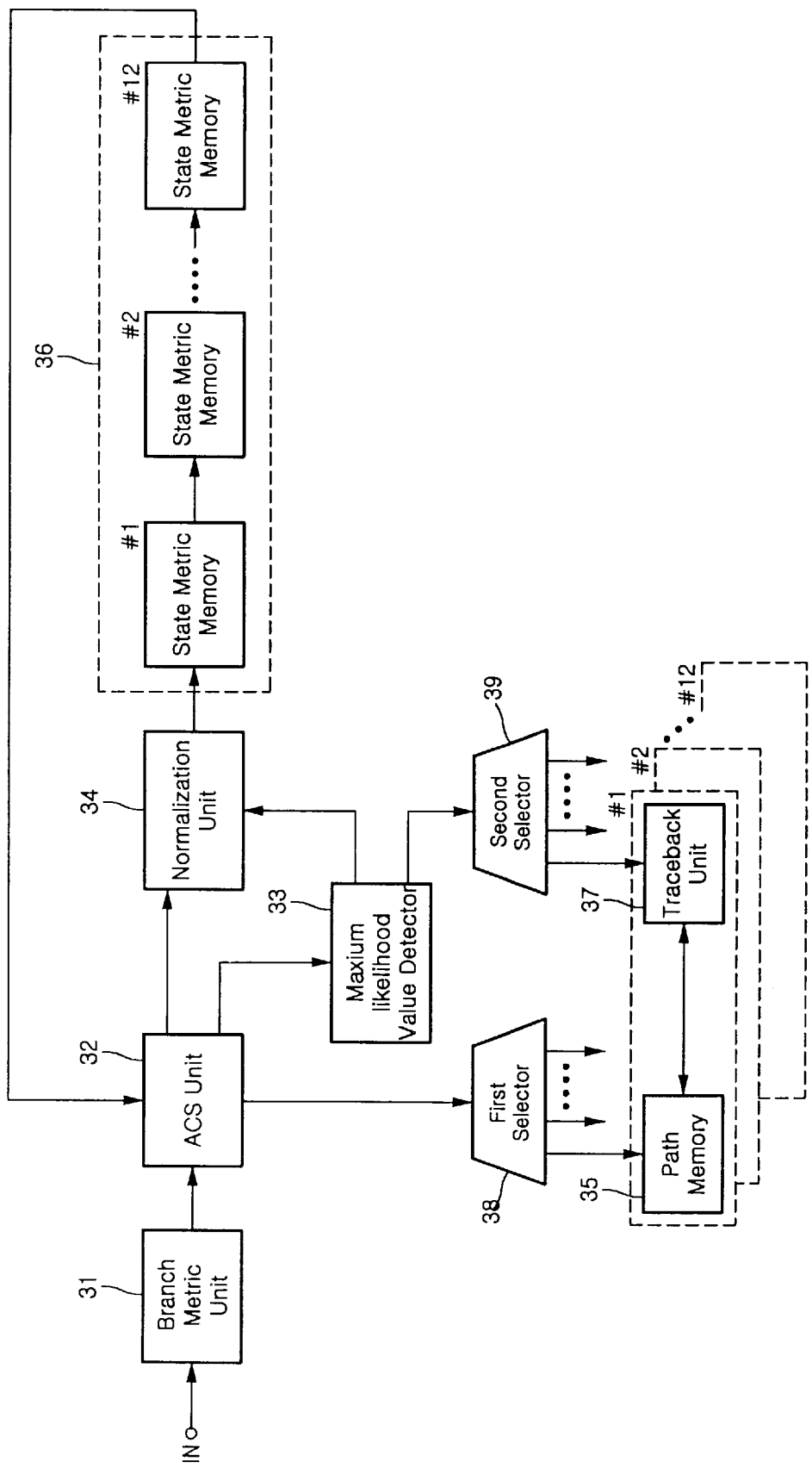
FIG. 10 is a view of a trellis decoder of a DTV in accordance with a second preferred embodiment of the present invention.

FIG. 10 illustrates a trellis decoder of a DTV in accordance with a second preferred embodiment of the present invention. While the first embodiment must have a 12-to-1 multiplexer and a 1-to-12 de-multiplexer to connect one ACS unit 32, the twelve state metric memories 36 for storing the state metric value of each state are sequentially arranged in series as a shift register instead of the 12-to-1 multiplexer and 1-to-12 de-multiplexer. This results in a curtailment of the hardware costs.

According to the second embodiment, the third and fourth selectors 40 and 41 of the first embodiment are not used. The construction is the same with the first embodiment but that the first to twelfth state metric memories are connected in series.

In the second embodiment as constructed above, the output of the normalization unit 34 is transferred into the ACS unit 32 through the first to twelfth state metric memories 36 in sequence. The other operations are the same as in the first preferred embodiment.

As described above, the present invention can realize a trellis coding interleaver by using a branch metric unit, an ACS unit, a maximum likelihood value detector, and a normalization unit in common by time-division method instead of using twelve equivalent trellis decoders. This makes it easier to construct the hardware for the trellis coding interleaver in VLSI with a decrease in the production cost.

It will be apparent to those skilled in the art that various modifications and variations can be made in the trellis decoder of a DTV according to the present invention without departing from the spirit or scope of the invention. Thus, it is intended that the present invention cover the modifications and variations of this invention provided they come within the scope of the appended claims and their equivalents.

What is claimed is:

1. A trellis decoder of a DTV, comprising:
   a branch metric unit for operating a branch metric of received input signals and reference values in each branch;
   a maximum likelihood value detector for detecting the most likely path and the state metric value having the most likely path from the state metric values transferred from an ACS (Add-Compare-Select) unit for selecting a path in each state from the output of the branch metric unit and obtaining the state metric value of the path;
   a normalization unit for performing a normalization using each of the state metric values transferred from the ACS unit and the state metric value having the most likely path to each state from the maximum likelihood value detector;
   a plurality of path memories for storing information concerning the path generated by the ACS unit;
   a plurality of state metric memories for storing the state metric values generated by the normalization unit;
   a plurality of traceback units for receiving the address of the state having the most likely path from the maximum likelihood value detector to control a traceback and decoding operation;
   a first selector for controlling the information concerning the path generated by the ACS unit to be stored in a proper one of the path memories;
   a second selector for controlling the output of the maximum likelihood value detector to be transferred into a proper one of the traceback units;
   a third selector for controlling the output of the normalization unit to be stored in a proper one of the state metric memories; and
   a fourth selector for controlling the outputs of the state metric memories to be transferred into the ACS unit.

2. The trellis decoder as defined in claim 1, wherein each of the first, second and third selectors comprises a 1-to-12 de-multiplexer.

3. The trellis decoder as defined in claim 1, wherein the fourth selector comprises a 12-to-1 multiplexer.

4. The trellis decoder as defined in claim 1, wherein the path memories, the state metric memories and the traceback units are employed each as many as required in a trellis coding deinterleaver.

5. A trellis decoder of a DTV, comprising:
   a branch metric unit for operating a branch metric of received input signals and reference values in each branch;
   an ACS (Add-Compare-Select) unit for selecting a path in each state from the output of the branch metric unit and obtaining the state metric value of the path;
   a maximum likelihood value detector for detecting the most likely path and the state metric value having the most likely path from the state metric values transferred from the ACS unit;
   a normalization unit for performing a normalization using each of the state metric values transferred from the ACS unit and the state metric value having the most likely path to each state from the maximum likelihood value detector;
   a plurality of path memories for storing information concerning the path generated by the ACS unit;
   first to twelfth state metric memories for sequentially storing the state metric values from the output of the normalization unit;
   a plurality of traceback units for receiving the address of the state having the most likely path from the maximum likelihood value detector to control a traceback and decoding operation;
   a first selector for controlling the information concerning the path generated by the ACS unit to be store a proper one of the path memories; and
   a second selector for controlling the output of the maximum likelihood value detector to be transferred into a proper one of the traceback units.

6. The trellis decoder as defined in claim 5, wherein each of the first and second selectors comprises a 1-to-12 de-multiplexer.

7. The trellis decoder as defined in claim 5, wherein the first to twelfth state metric memories are sequentially arranged in series and connected as a shift register.

8. The trellis decoder as defined in claim 5, wherein the path memories and the traceback units are employed each as many as required in a trellis coding deinterleaver.

* * * * *